United States Patent
Joshi et al.

(10) Patent No.: US 10,818,576 B2
(45) Date of Patent: Oct. 27, 2020

(54) METHODS OF FORMING POWER ELECTRONIC ASSEMBLIES USING METAL INVERSE OPALS AND CAP STRUCTURES

(71) Applicants: Toyota Motor Engineering & Manufacturing North America, Inc., Plano, TX (US); The Board of Trustees of the University of Illinois, Champaign, IL (US)

(72) Inventors: Shailesh N. Joshi, Ann Arbor, MI (US); Naoya Take, Canton, MI (US); Paul Braun, Champaign, IL (US); Julia Kohanek, Champaign, IL (US); Gaurav Singhal, Mumbai (IN)

(73) Assignees: TOYOTA MOTOR ENGINEERING & MANUFACTURING NORTH AMERICA, INC., Plano, TX (US); THE BOARD OF TRUSTEES OF THE UNIVERSITY OF ILLINOIS, Champaign, IL (US)

( * ) Notice: Subject to any disclaimer, the term of this patent is extended or adjusted under 35 U.S.C. 154(b) by 0 days.

(21) Appl. No.: 16/243,751

(22) Filed: Jan. 9, 2019

(65) Prior Publication Data

US 2020/0219792 A1 Jul. 9, 2020

(51) Int. Cl.
  *H01L 23/473* (2006.01)
  *H01L 21/48* (2006.01)
  (Continued)

(52) U.S. Cl.
  CPC ...... *H01L 23/4735* (2013.01); *H01L 21/4871* (2013.01); *H01L 21/6835* (2013.01);
  (Continued)

(58) Field of Classification Search
  None
  See application file for complete search history.

(56) References Cited

U.S. PATENT DOCUMENTS 7,872,563 B2 1/2011 Braun et al.
9,198,302 B2 11/2015 Elger
(Continued)

FOREIGN PATENT DOCUMENTS

DE 102010013610 B4 4/2013

OTHER PUBLICATIONS

Yoonjin, et al.,"Mechanical and thermal properties of copper inverse opals for two-phase convection enhancement", Jun. 20, 2018 https://nanoheat.stanford.edu/sites/default/files/publications/ITHERM_2014_Won.pdf.

(Continued)

*Primary Examiner* — Charles D Garber
*Assistant Examiner* — Xiaoming Liu
(74) *Attorney, Agent, or Firm* — Dinsmore & Shohl LLP

(57) ABSTRACT

Methods for forming bonded assemblies using metal inverse opal and cap structures are disclosed. In one embodiment, a method for forming a bonded assembly includes positioning a substrate against a polymer support that is porous, depositing a metal onto and within the polymer support, disposing a cap layer to the polymer support opposite of the substrate to form a bottom electrode, and removing the polymer support from between the substrate and the cap layer to form a metal inverse opal structure disposed therebetween.

20 Claims, 10 Drawing Sheets

(51) Int. Cl.
*H01L 21/683* (2006.01)
*H01L 23/00* (2006.01)

(52) U.S. Cl.
CPC .............. *H01L 24/32* (2013.01); *H01L 24/33* (2013.01); *H01L 24/48* (2013.01); *H01L 24/73* (2013.01); *H01L 2221/68345* (2013.01); *H01L 2221/68381* (2013.01); *H01L 2224/32225* (2013.01); *H01L 2224/32245* (2013.01); *H01L 2224/33181* (2013.01); *H01L 2224/48091* (2013.01); *H01L 2224/48175* (2013.01); *H01L 2224/73215* (2013.01); *H01L 2224/73265* (2013.01); *H01L 2924/10253* (2013.01); *H01L 2924/10272* (2013.01)

(56) References Cited

U.S. PATENT DOCUMENTS

| | | |
|---|---|---|
| 9,518,309 B2 | 12/2016 | Choi et al. |
| 9,653,411 B1 | 5/2017 | Lu et al. |
| 9,997,451 B2 | 6/2018 | Briggs et al. |
| 2010/0068623 A1* | 3/2010 | Braun ................. C25F 3/02 429/219 |
| 2011/0198754 A1 | 8/2011 | Tagami et al. |
| 2014/0011014 A1* | 1/2014 | King ................... C25D 5/02 428/312.2 |
| 2014/0015119 A1* | 1/2014 | Bonkohara ........... H01L 23/473 257/713 |
| 2014/0111956 A1* | 4/2014 | Taniguchi ............. B23K 35/02 361/771 |
| 2016/0049351 A1* | 2/2016 | McCann ................ H01L 24/27 257/76 |
| 2017/0062304 A1 | 3/2017 | Joshi et al. |
| 2017/0325332 A1* | 11/2017 | Long ................... H05K 1/144 |
| 2018/0040563 A1* | 2/2018 | Yoshida ............. H01L 29/7802 |

OTHER PUBLICATIONS

Dusseault, et al.,"Inverse opals for fluid delivery in electronics cooling systems", Jun. 20, 2018 https://nanoheat.stanford.edu/sites/default/files/publications/dusseault_final.pdf.

* cited by examiner

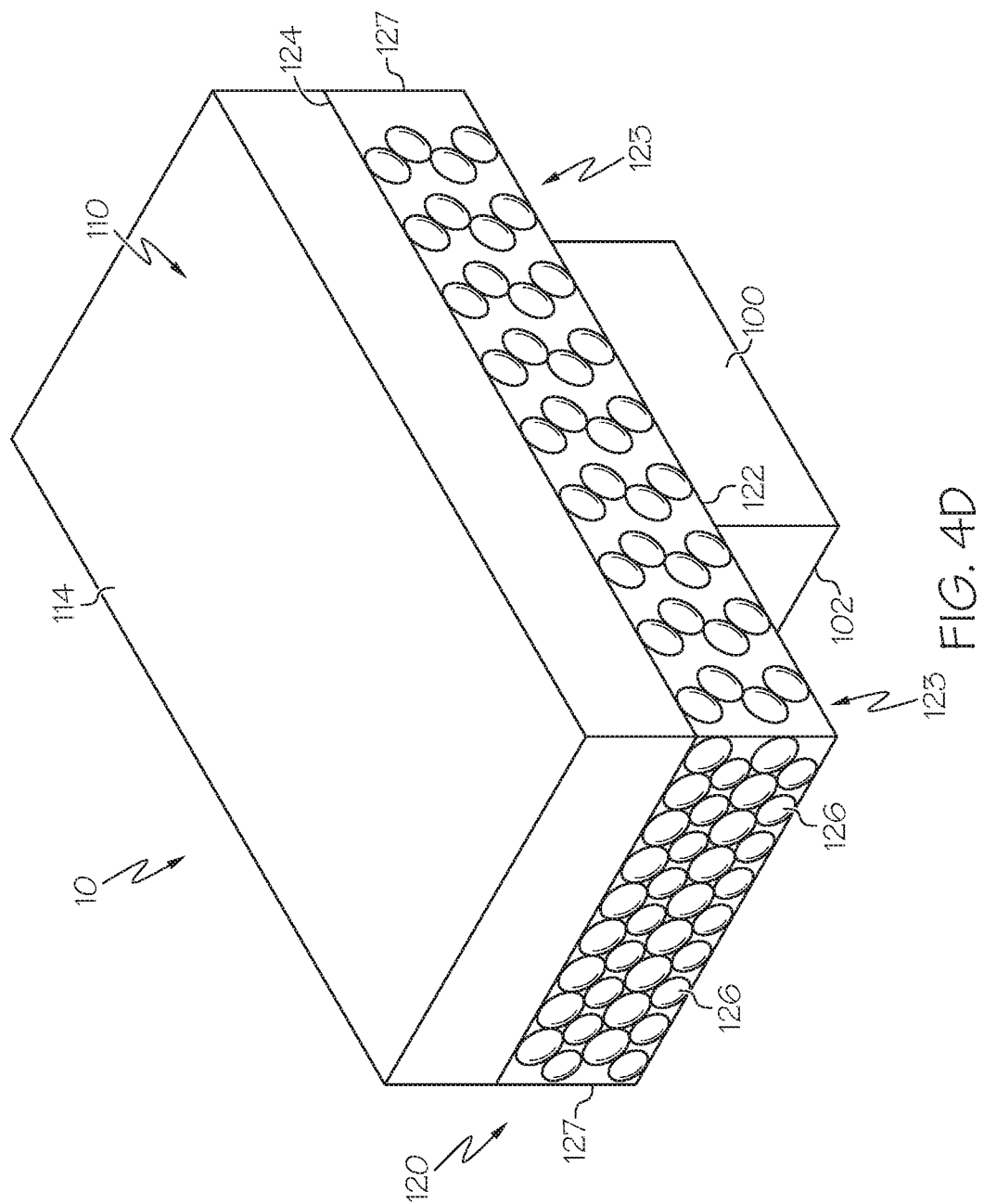

METHODS OF FORMING POWER ELECTRONIC ASSEMBLIES USING METAL INVERSE OPALS AND CAP STRUCTURES

TECHNICAL FIELD

The present specification generally relates to power electronics assemblies, and more particularly, methods for forming power electronics assemblies with bonding layers that provide electrical contact between electrodes, cooling of semiconductor devices, and thermal stress compensation between semiconductor devices bonded to substrates during the manufacture of power electronic assemblies.

BACKGROUND

Power electronics devices are often utilized in high-power electrical applications, such as inverter systems for hybrid electric vehicles and electric vehicles. Such power electronics devices include power semiconductor devices such as power insulated-gate bipolar transistors (IGBTs) and power transistors thermally bonded to a metal substrate. With advances in battery technology and increases in electronics device packaging density, operating temperatures of power electronics devices have increased and exceed 200° Celsius. Heat sinking devices may be coupled to the power electronics devices to remove heat and lower the maximum operating temperature of a power semiconductor device. Cooling fluid may be used to receive heat generated by the power semiconductor device by convective thermal transfer, and remove such heat from the power semiconductor device. For example, a jet of cooling fluid may be directed such that it impinges a surface of the power semiconductor device. Another way to remove heat from a power semiconductor device is to couple the power semiconductor device to a finned heat sink made of a thermally conductive material, such as aluminum.

However, as power electronics devices are designed to operate at increased power levels thereby generating more heat due to the demands of newly developed electrical systems, conventional heat sinks are unable to adequately remove sufficient heat to effectively lower the operating temperature of the power electronics devices to acceptable temperature levels. Further, conventional heat sinks and cooling structures require additional bonding layers and thermal matching materials (e.g., bond layers, substrates, thermal interface materials). These additional layers add substantial thermal resistance to the overall assembly and make thermal management of the electronics system challenging.

Accordingly, a need exists for alternative power electronics assemblies and power electronics devices having internal cooling structures, and in particular, methods for fabricating said alternative power electronic assemblies.

SUMMARY

In one embodiment, a method for forming a bonded assembly that includes positioning a substrate against a polymer support that is porous, depositing a metal onto and within the polymer support, disposing a cap layer to the polymer support opposite of the substrate to form a bottom electrode, and removing the polymer support from between the substrate and the cap layer to form a metal inverse opal structure disposed therebetween.

In another embodiment, a method for bonding a semiconductor device to a substrate using metal inverse opals, the method includes positioning the semiconductor device onto a polymer support, wherein the polymer support is porous, and electrodepositing metal onto and within the polymer support thereby bonding the semiconductor device to the polymer support. The method further includes removing the polymer support from the semiconductor device to provide a metal inverse opal structure secured along the semiconductor device, and depositing a cap layer on the metal inverse opal structure to form the substrate that is coupled to the semiconductor device.

In another embodiment, a method for forming a power electronic assembly includes attaching a polystyrene mesh to a semiconductor device and electrodepositing copper onto the polystyrene mesh to bond the semiconductor device to the polystyrene mesh. The method further includes depositing a cap structure onto the polystyrene mesh to form a copper substrate, and dissolving the polystyrene mesh to produce a copper inverse opal structure in contact with the semiconductor device and the copper substrate.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 4D schematically depicts the method of FIG. 2D in fabricating the bonding assembly of FIG. 1 by removing the polymer support and forming the metal inverse opal structure between the substrate and cap structure according to one or more embodiments shown and described herein;

DETAILED DESCRIPTION

One non-limiting example of a simplified method for forming a bonding assembly (e.g., a power electronic assembly) with an internal cooling structure includes positioning a substrate against a porous polymer support and depositing a metal, such as, for example, copper, onto the porous polymer support. By depositing the metal onto the porous polymer support, the metal may be received in and extend through the plurality of pores of the polymer support. In this instance, removing the polymer support forms a metal inverse opal (MIO) bonding structure secured against the substrate. With the MIO bonding structure formed against the substrate and within the polymer support, a cap layer formed of metal may be disposed onto the MIO bonding structure and/or polymer support along a side of the bonding assembly opposite a side of the substrate. The porous polymer support may thereafter be removed from the substrate, for example, by dissolving the polymer support, to form the bonding assembly with the MIO bonding structure disposed between and bonded to the substrate and the cap layer. Excess or overhang portions of the MIO bonding structure may be removed from the bonding assembly to size and shape the MIO structure in correspondence to the size of the substrate and/or cap layer.

The MIO bonding structure may serve as an electrically conductive layer between the substrate and the cap layer such that the substrate may be in electrical communication with the cap layer through the porous MIO bonding structure. Additionally, the MIO bonding structure may provide a thermally conductive cooling layer for the assembly such that a cooling fluid may enter the assembly and flow through the MIO bonding structure to thereby cool the substrate and/or the cap layer. The MIO bonding structure may provide a thermal stress compensation layer to the bonding assembly and be incorporated into inverter systems of electrified vehicles described herein to reduce thermally-induced stresses due to CTE mismatch without the need for additional interface layers. Various embodiments of the MIO bonding structure and bonding assemblies including the MIO bonding structure will be described in greater detail herein.

Figure 1:
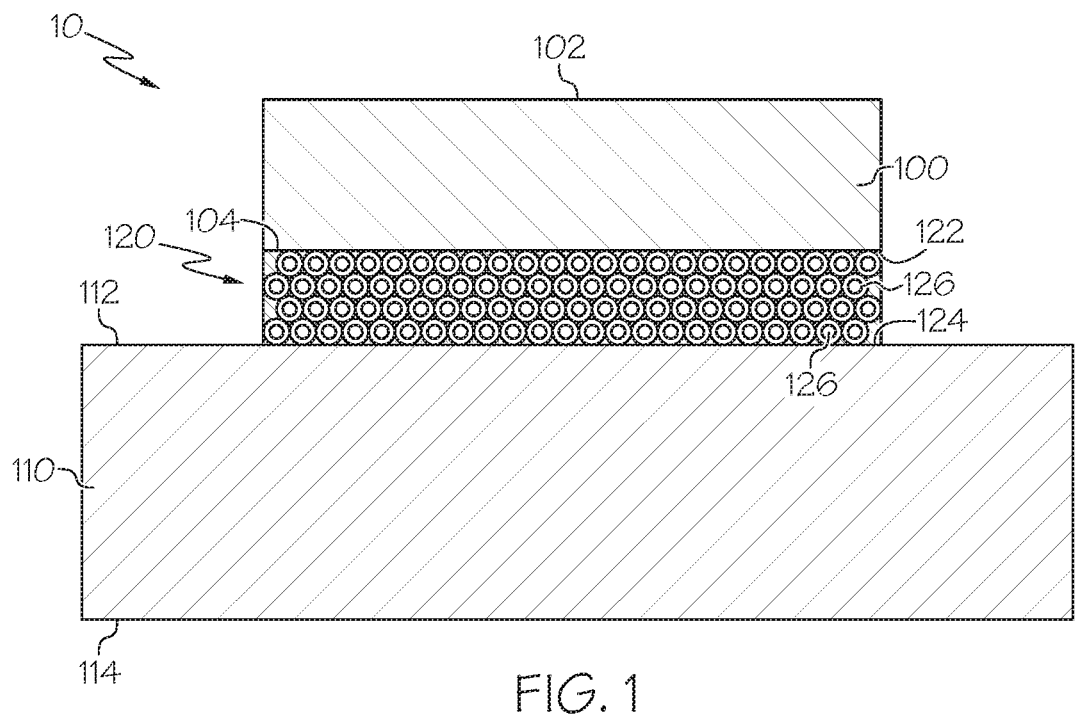
FIG. 1 schematically depicts a side view of a bonding assembly having a substrate thermally bonded to a cap structure with a metal inverse opal structure disposed therebetween that provides electrical contact and cooling of the bonding assembly according to one or more embodiments shown and described herein.

Referring initially to FIG. 1, a non-limiting example of a bonding assembly 10, such as, for example, a power electronic assembly, is illustrated. The example bonding assembly 10 generally comprises a substrate 100 with a top surface 102 and a bottom surface 104, and a cap structure 110 with a top surface 112 and a bottom surface 114. An MIO bonding structure 120 with a top surface 122 and a bottom surface 124 is positioned between and bonded to the substrate 100 and the cap structure 110. In particular, the bottom surface 104 of the substrate 100 is bonded to the MIO bonding structure 120 along the top surface 122, and the top surface 112 of the cap structure 110 is bonded to the MIO bonding structure 120 along the bottom surface 124. As will be described in greater detail herein, the MIO bonding structure 120 may be formed and bonded to the substrate 100 and the cap structure 110 by depositing a metal within a porous polymer support 106 that is positioned against the substrate 100 prior to attachment of the cap structure 110 onto the bonding assembly 10.

The substrate 100 may be any component. In some embodiments, the substrate 100 may comprise a semiconductor device and may be formed from a wide band gap semiconductor material suitable for the manufacture or production of power semiconductor devices such as power insulated-gate bi-polar transistors (IGBTs), power metal-oxide field-effect transistors (MOSFETs), power transistors, and the like. In some embodiments, the substrate 100 may be formed from wide band gap semiconductor materials. Non-limiting examples of such wide band gap semiconductor materials include silicon carbide (SiC), aluminum nitride (AlN), gallium nitride (GaN), gallium oxide (Ga2O3), boron nitride (BN), diamond, and/or the like.

The cap structure 110 serves as a bottom substrate for the bonding assembly 10 and may be formed of any type of substrate for power semiconductor device assemblies known to those skilled in the art. Non-limiting examples include metal substrates, e.g., substrates formed from copper (Cu), e.g., oxygen free Cu, aluminum (Al), Cu alloys, Al alloys, and the like, direct bonded copper substrates or semiconductor (e.g., silicon) substrates. In embodiments, the cap structure 110 may be plated with a metal along an exterior surface, such as, for example, aluminum (Al), nickel (N), and the like. As will be described in greater detail herein, the cap structure 110 may be formed from a thermally conductive material such that heat from the substrate 100 is transferred to the MIO bonding structure 120 interlaid between the substrate 100 and the cap structure 110.

The thickness of the substrate 100 and the cap structure 110 may depend on the intended use of the bonding assembly 10. In non-limiting examples, the substrate 100 has a thickness within the range of about 0.1 millimeters to about 0.3 millimeters, and the cap structure 110 has a thickness within the range of about 1.0 millimeter to about 2.0 millimeters (including endpoints). In this instance, the bonding assembly 10 may have a maximum height within the range of about 1.1 millimeters to about 2.3 millimeters. It should be understood that other thicknesses of the substrate 100 and/or the cap structure 110 may be utilized in bonding assembly 10.

The MIO bonding structure 120 may be any inverse opal structure, such as, for example, a metal inverse opal structure (e.g., a copper inverse opal (CIO) structure, a nickel inverse opal (NIO) structure, or the like) or the like. The MIO bonding structure 120 has a plurality of hollow spheres 126 that define a porosity of the MIO bonding structure 120. The plurality of hollow spheres 126 provides a thermal conductivity for the MIO bonding structure 120 between the substrate 100 and the cap structure 110. In particular, the plurality of hollow spheres 126 define a plurality of dimples (or other similar depressions or indentations) such that fluid introduced into the assembly 10 can flow through each of the plurality of networked hollow spheres 126 throughout the MIO bonding structure 120 and contact a greater amount of surface area for the purposes of heat transfer. In some embodiments, the MIO bonding structure 120 further includes a plurality of pores extending therethrough.

It should be understood that inverse opal structures (including MIO structures) have a high permeability as inverse opal wick structures provide the advantage of improved control over pore sizes and distribution. Accordingly, the thermal conductivity of the MIO bonding structure 120 can be varied and controlled to accommodate thermomechanical stresses generated within the bonding assembly 10. In some embodiments, the MIO bonding structure 120 is further configured to provide heat flux thermal management within the bonding assembly 10 such that the MIO bonding structure 120 may improve heat exchange between the substrate 100 and the cap structure 110 at a high heat removal rate. As will be described in greater detail below, it should be understood that, in other embodiments, the bonding assembly 10 may include other arrangements and configurations than that shown and described above. While the hollow spheres 126 of the present example are specifically shown and described herein as defining a series of dimples and/or pores throughout the MIO bonding structure 120, other surface features contained within the MIO bonding structure 120 may also be included without departing from the scope of the present disclosure.

The number of hollow spheres 126 and/or other surface features present in the MIO bonding structure 120 is not limited by the present disclosure, and may be any number so long as the connectivity between the material of the MIO bonding structure 120 and the top surface 112 of the cap structure 110 and the bottom surface 104 of the substrate 100 is maintained. Thus, as fluid flows through the plurality of hollow spheres 126 and/or other surface features of the MIO bonding structure 120 (i.e., pores), latent heat carried from the fluid is transferred through the MIO bonding structure 120 to other portions of the bonding assembly 10 to draw heat away from the one or more heat generating devices (i.e., the substrate 100). In some embodiments, heat can be transferred to the fluid from the MIO bonding structure 120 such that the fluid carries the heat away from the substrate 100. While the plurality of hollow spheres 126 appears generally spherical in shape, this is merely illustrative. Accordingly, it should be understood that the plurality of hollow spheres 126 may be any shape (including irregular shapes). The shape of the hollow spheres 126 may be determined from the shape of the materials used to form the MIO bonding structure 120. Further, the thickness of the MIO bonding structure 120 is not limited by the present disclosure, and may generally be any thickness.

As briefly described above, the MIO bonding structure 120 may generally be constructed of a thermally conductive material, but is otherwise not limited by the present disclosure. In some embodiments, the material used for the MIO bonding structure 120 may be selected based on the process used to form the MIO bonding structure 120, as described in greater detail herein. For example, if the MIO bonding structure 120 is formed from an MIO formation process, metals that are suitable for such a formation process may be used. Illustrative examples of materials that may be used include, but are not limited to, aluminum, nickel, copper, silver, gold, an alloy containing any of the foregoing, a compound containing any of the foregoing, and the like. Other materials that are generally understood to result from an inverse opal formation process that are not specifically disclosed herein are also included within the scope of the present disclosure.

Figure 2A:
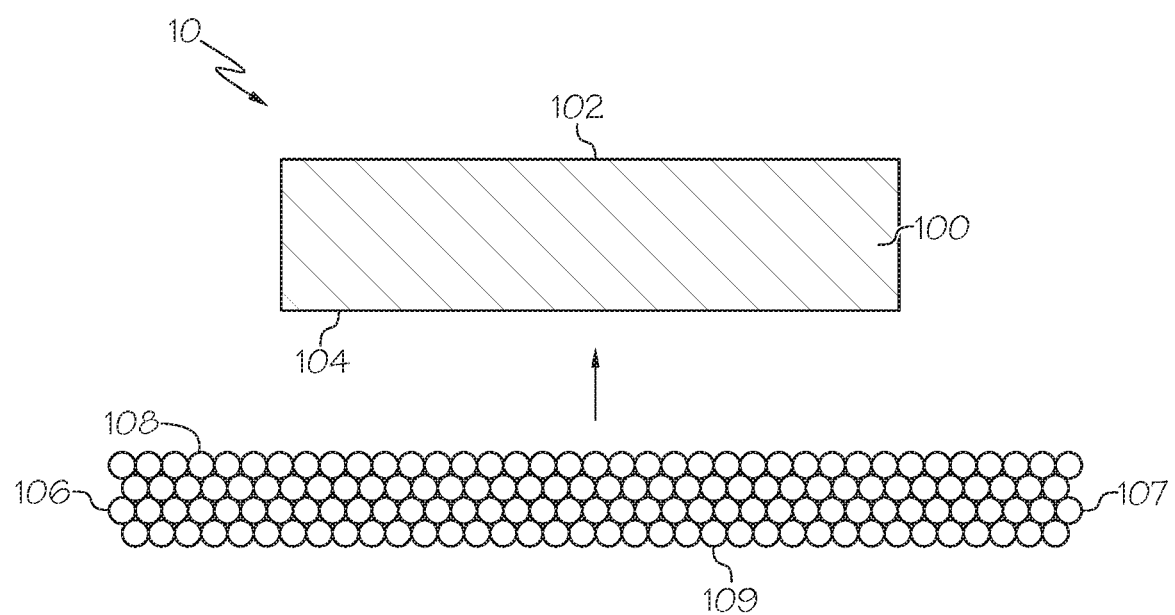
FIG. 2A schematically depicts a method of fabricating the bonding assembly of FIG. 1 by positioning a polymer support against the substrate according to one or more embodiments shown and described herein.
Figure 2B:
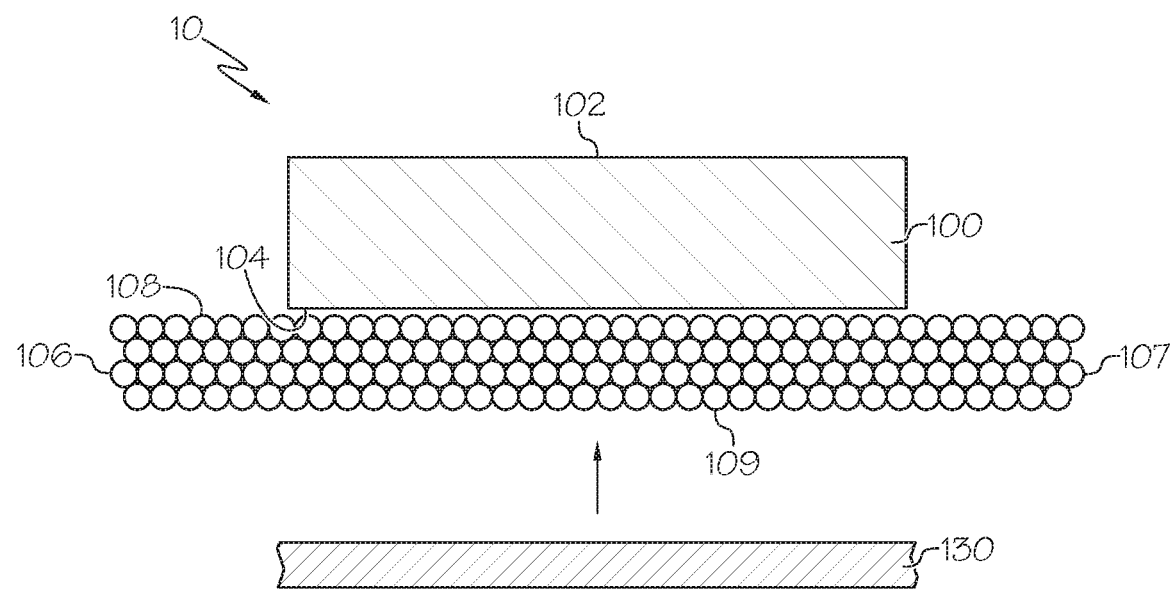
FIG. 2B schematically depicts a method of fabricating the bonding assembly of FIG. 1 by depositing a metal within the polymer support according to one or more embodiments shown and described herein.
Figure 2C:
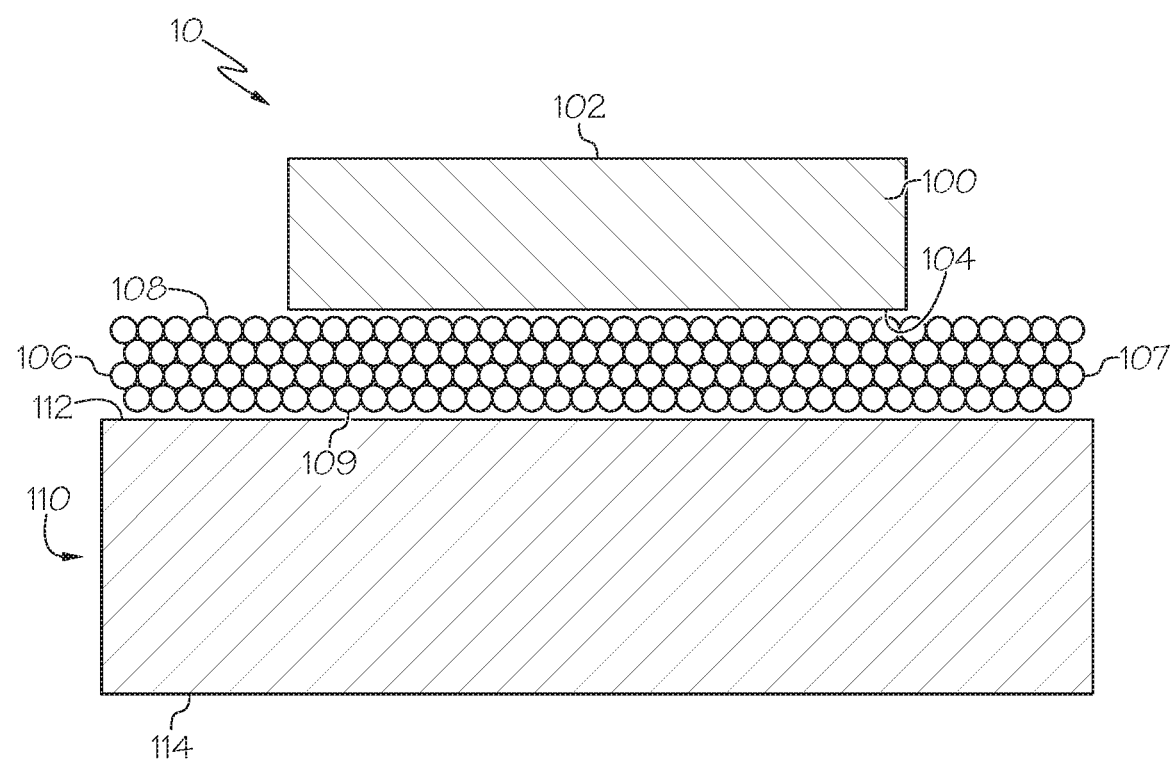
FIG. 2C schematically depicts a method of fabricating the bonding assembly of FIG. 1 by depositing a cap structure against the polymer support according to one or more embodiments shown and described herein.
Figure 2D:
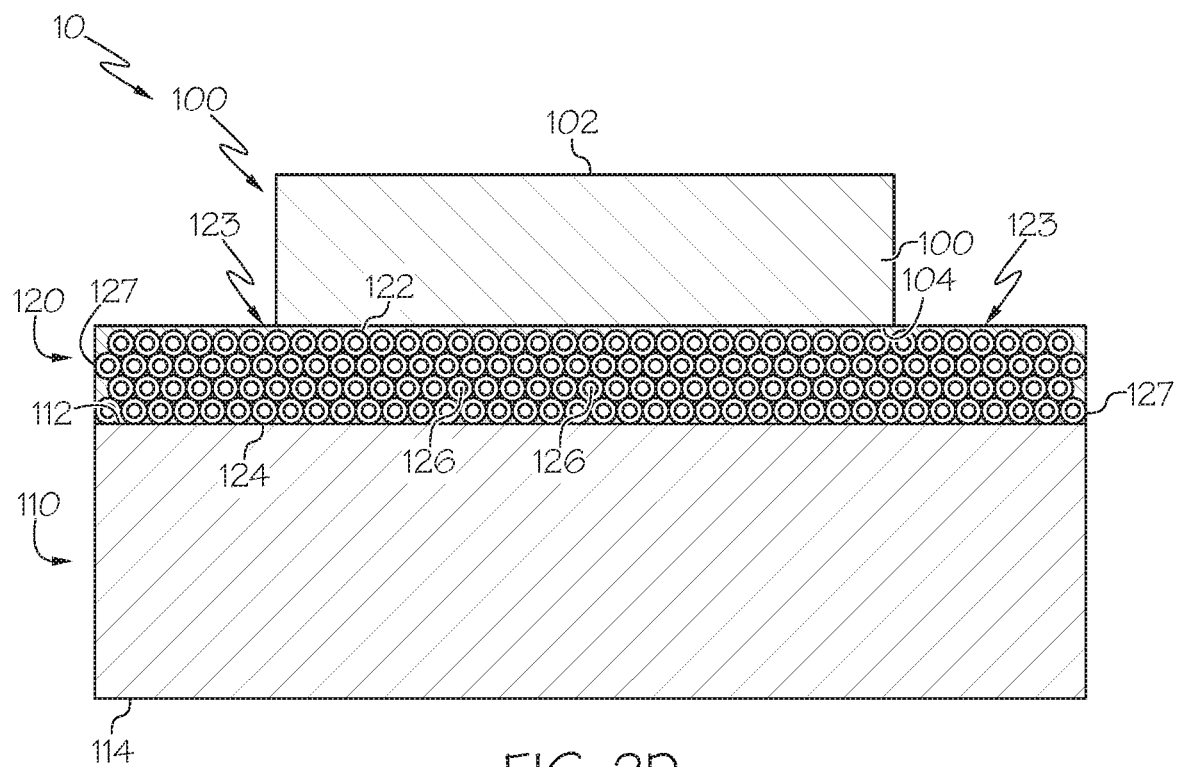
FIG. 2D schematically depicts a method of fabricating the bonding assembly of FIG. 1 by removing the polymer support and forming the metal inverse opal structure between the substrate and cap structure according to one or more embodiments shown and described herein.
Figure 2E:
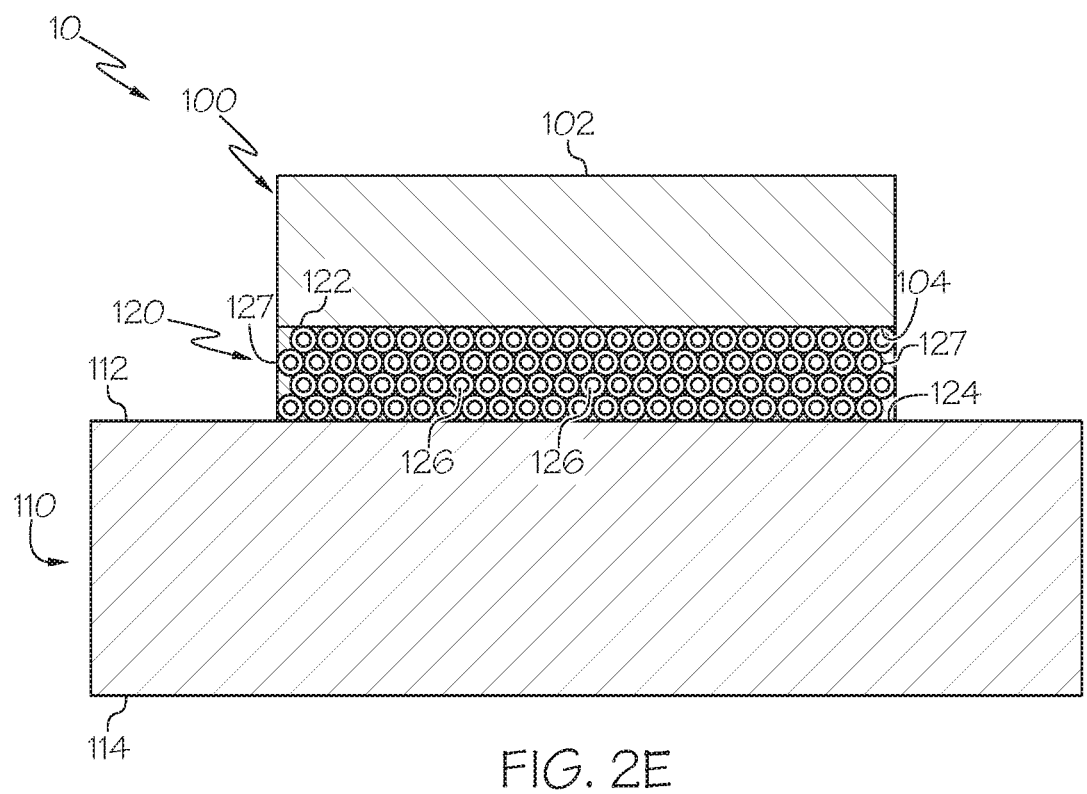
FIG. 2E schematically depicts a method of fabricating the bonding assembly of FIG. 1 by removing overhang portions of the metal inverse opal structure according to one or more embodiments shown and described herein.
Figure 3:
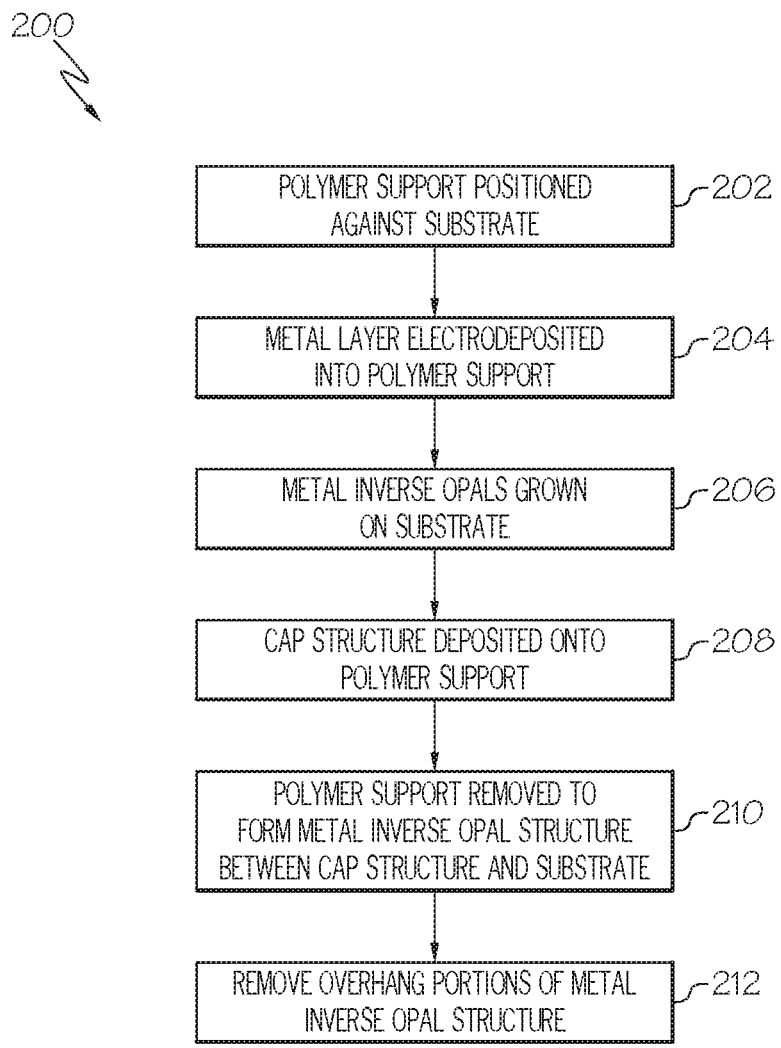
FIG. 3 is a flowchart of the method of FIGS. 2A-2E for fabricating the bonding assembly according to one or more embodiments shown and described herein.
Figure 4A:
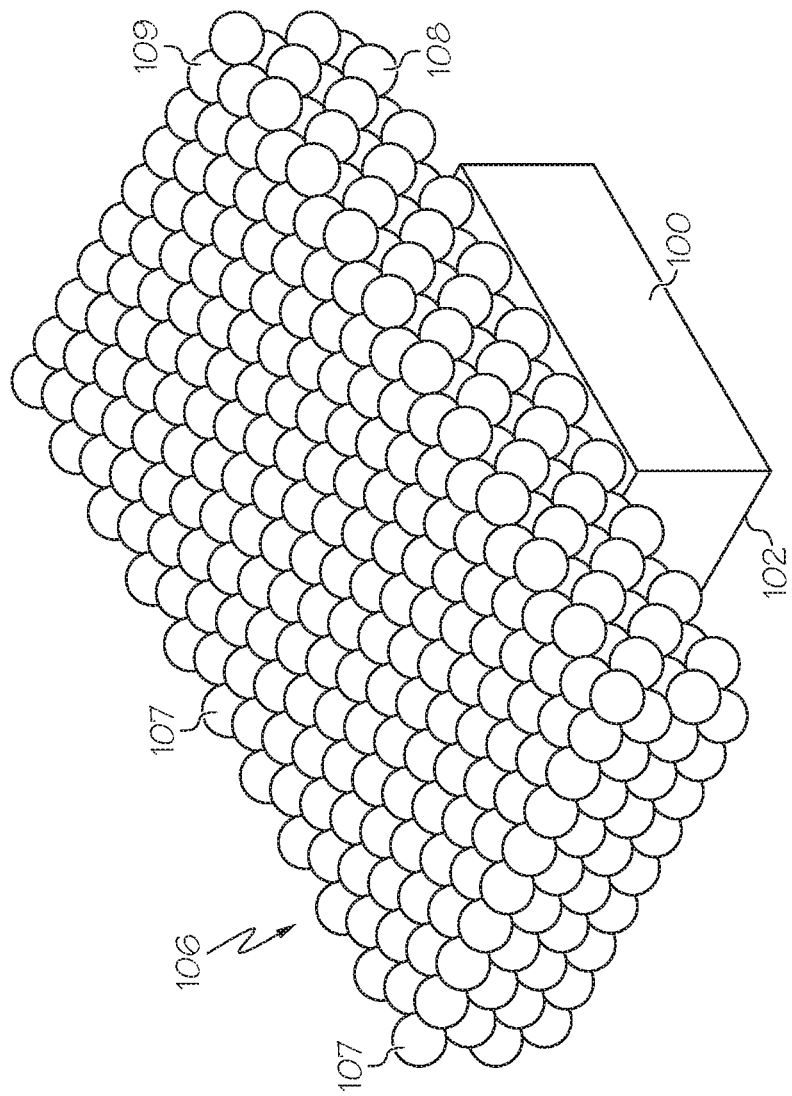
FIG. 4A schematically depicts the method of FIG. 2A in fabricating the bonding assembly of FIG. 1 by positioning the polymer support against the substrate according to one or more embodiments shown and described herein.

Referring now to FIGS. 2A-2E, FIGS. 4A-4E and the flow chart of FIG. 3, an example method 200 for forming the bonding assembly 10 with the porous polymer support generally described above is shown. It should be understood that method 200 is merely illustrative and that the bonding assembly 10 may be formed in various other methods. Initially at step 202 (FIG. 3), and as seen in FIGS. 2A and 4A, a polymer support 106 is positioned against the substrate 100. In particular, the polymer support 106 includes a top surface 108 and a bottom surface 109, such that the top surface 108 is positioned against the bottom surface 104 of the substrate 100. In this instance, the substrate 100 and the polymer support 106 are not bonded together by an intermediary bonding layer disposed therebetween.

Figure 4B:
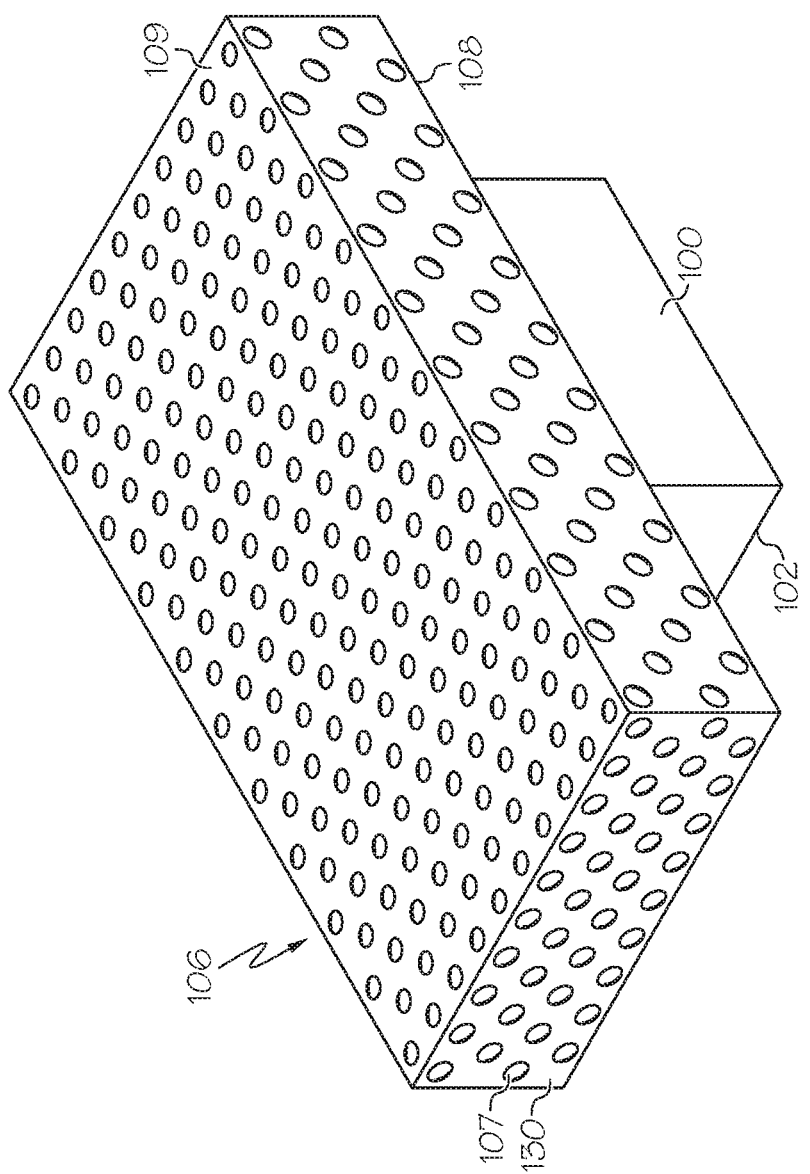
FIG. 4B schematically depicts the method of FIG. 2B in fabricating the bonding assembly of FIG. 1 by depositing the metal within the polymer support according to one or more embodiments shown and described herein.

In some embodiments, the polymer support 106 is a polystyrene structure formed of a plurality of pores 107 extending between the top surface 108 and the bottom surface 109. In other words, the structure of the polymer support 106 is formed of a plurality of polystyrene spheres forming a plurality of pores 107 disposed between the plurality of spheres. The plurality of pores 107 are sized and shaped to form an interconnected network of pores 107 throughout the polymer support 106. The plurality of pores 107 is configured to receive a metal 130 therethrough. At step 204, and as seen in FIGS. 2B and 4B, the metal 130 may be deposited along the bottom surface 109 of the polymer support 106, and in particular, electrolytically or electrolessly deposited onto the polymer support 106. In this instance, the metal 130 is received in and transferred through the polystyrene structure of the polymer support 106. Accordingly, the metal 130 is received through the plurality of pores 107 of the polymer support 106. The metal 130 may be formed from any electrically conductive material, such as, for example, copper (Cu), aluminum (Al), nickel (Ni), iron (Fe), zinc (Zn), alloys thereof, and the like. As used herein, the term "alloys thereof" refers to alloys not limited to the elements listed unless otherwise stated. For example, a Cu alloy as disclosed herein may include an alloy formed from Cu and elements other than Al, Ni, Fe, and Zn. In the alternative, a Cu alloy as disclosed herein may include an alloy formed from Cu with Al, Ni, Fe and/or Zn, plus additional elements. In another alternative, a Cu alloy as disclosed herein may include an alloy formed from only Cu and Al, Ni, Fe and/or Zn plus any incidental impurities present from manufacturing of the Cu alloy.

Figure 4C:
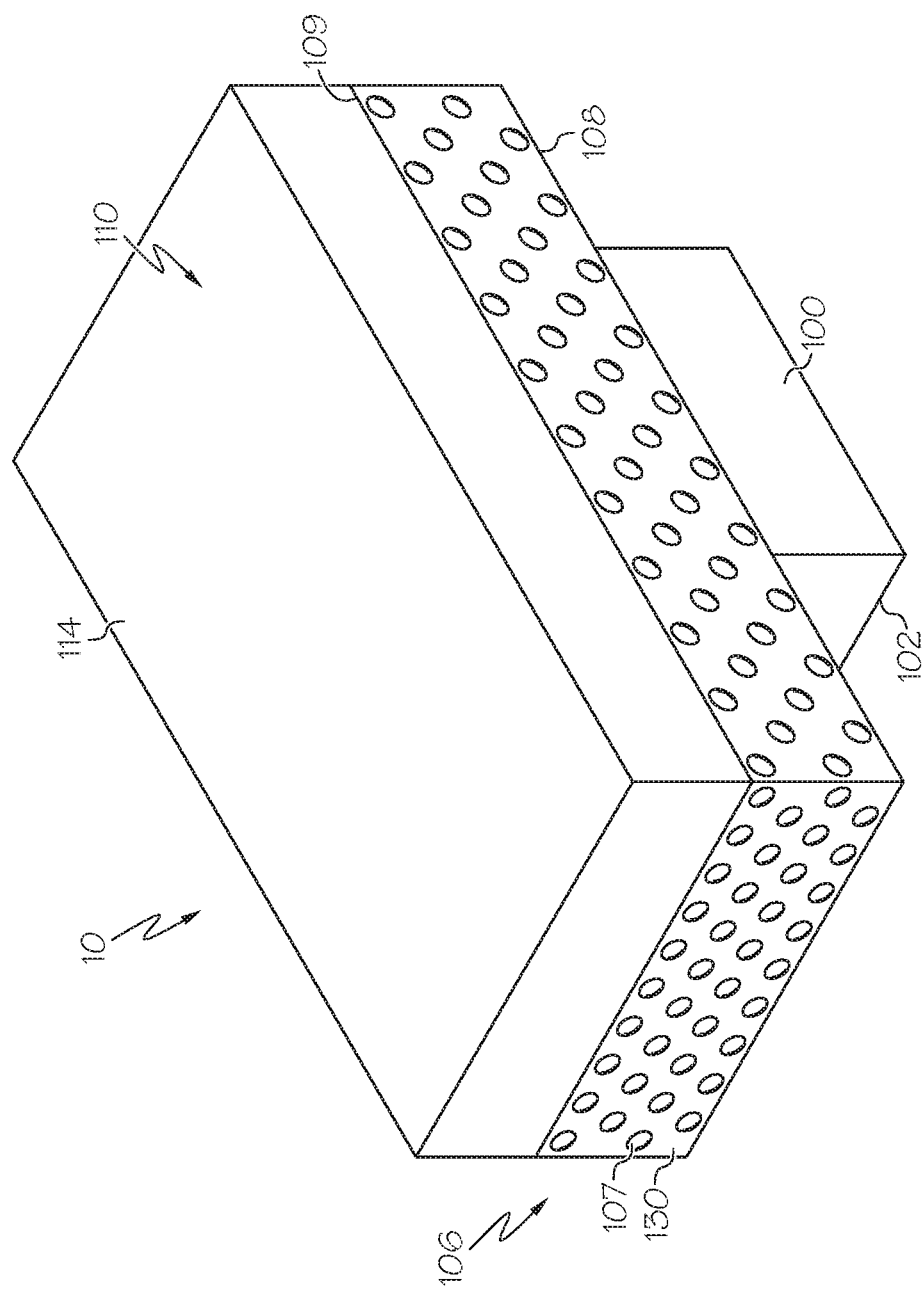
FIG. 4C schematically depicts the method of FIG. 2C in fabricating the bonding assembly of FIG. 1 by depositing the cap structure against the polymer support according to one or more embodiments shown and described herein.

With the metal 130 received within the plurality of pores 107 of the polymer support 106, metal inverse opals are effectively grown on the substrate 100 at step 206, and in particular, along the bottom surface 104 of the substrate 100 where the polymer support 106 engages the substrate 100. At step 208, and as seen in FIGS. 2C and 4C, the cap structure 110 may be provided, and in particular, deposited onto the polymer support 106. For instance, the top surface 112 of the cap structure 110 may be electroplated onto the bottom surface 109 of the polymer support 106 thereby bonding the cap structure 110 to the polymer support 106 along a surface opposite of the substrate 100. In some embodiments, the cap structure 110 may be bonded to the polymer support 106 via thermal bonding, transient liquid phase (TLP) bonding, electrolytic or electroless bonding, and/or the like.

With the cap structure 110 securely fixed to the bonding assembly 10, the polymer support 106 may be removed at step 210. Referring now to FIGS. 2D and 4D, removing the polymer support 106 from between the substrate 100 and the cap structure 110 forms the MIO bonding structure 120 within the bonding assembly 10. It should be understood that the polymer support 106 may be removed from the bonding assembly 10 via various methods, including but not limited to, dissolving the polymer support 106 with a solution to thereby uncover the MIO bonding structure 120 formed within the porous structure of the polymer support 106. In this instance, the MIO bonding structure 120 is disposed between and bonded to the substrate 100 and the cap structure 110, and in particular, the top surface 122 of the MIO structure is bonded to the bottom surface 104 of the substrate 100 and the bottom surface 124 of the MIO structure is bonded to the top surface 112 of the cap structure 110.

In other embodiments, it should be understood that the polymer support 106 may be removed from the bonding assembly 10 prior to the attachment of the cap structure 110 such that the cap structure 110 is bonded directly to the MIO bonding structure 120. It should be understood that in other embodiments, the polymer support 106 may be initially positioned against the cap structure 110, rather than the substrate 100 as described above, such that the bottom surface 109 of the polymer support 106 is positioned against the top surface 112 of the cap structure 110. In this instance, the metal 130 received within the plurality of pores 107 of the polymer support 106 effectively provides metal inverse opals on the cap structure 110 prior to the substrate 100 being deposited onto the polymer support 106. The bottom surface 104 of the substrate 100 may be electroplated onto the top surface 108 of the polymer support 106, thereby bonding the substrate 100 to the polymer support 106 along a surface opposite of the cap structure 110. As described above, the substrate 100 may be bonded to the polymer support 106 via thermal bonding, transient liquid phase (TLP) bonding, electrolytic or electroless bonding, and/or the like.

The MIO bonding structure 120 includes a plurality of interconnected hollow spheres 126 defining a skeletal network of metal formed by the plurality of pores 107 of the polymer support 106. The MIO bonding structure 120, formed of the metal 130, serves as an electrically conductive layer positioned between the substrate 100 and the cap structure 110. Accordingly, it should be understood that the MIO bonding structure 120 may provide an electrically conductive path between the substrate 100 and the cap structure 110. The MIO bonding structure 120 has a predetermined thermal conductivity that may compensate for thermally induced stresses between the substrate 100 and the cap structure 110 generated during use of the bonding assembly 10 and/or bonding of the cap structure 110 to the substrate 100.

The skeletal network of metal of the MIO bonding structure 120 has a large surface area and the amount of porosity of the MIO bonding structure 120 can be varied during fabrication by changing the size of the plurality of pores 107 of the polymer support 106. Further, the size of the hollow spheres 126 of the MIO bonding structure 120 may be varied as a function of the thickness of the MIO bonding structure 120 such that a graded porosity, i.e. graded hollow sphere diameter, is provided as a function of thickness. The size (diameter) of the plurality of hollow spheres 126 may be about 500 micrometers. It should be understood that the maximum height of the bonding assembly 10 is dependent on, in addition to a thickness of the substrate 100 and the cap structure 110, the size (diameter) of the plurality of hollow spheres 126 of the MIO bonding structure 120.

The MIO bonding structure 120 may further provide cooling of the substrate 100 during operation of the bonding assembly 10. In particular, as noted above, the MIO bonding structure 120 includes a plurality of hollow spheres 126 disposed between the top surface 122 and the bottom surface 124 such that the MIO bonding structure 120 has an open porous structure through which fluid can flow through. Accordingly, the MIO bonding structure 120 may be part of a cooling fluid circuit (not shown) for the bonding assembly 10. In this embodiment, the cooling fluid circuit may comprise a cooling fluid inlet, a cooling fluid outlet, and a cooling fluid path extending through the MIO bonding structure 120. In this instance, the cooling fluid may enter the bonding assembly 10 through the cooling fluid inlet, flow through the MIO bonding structure 120, and exit the bonding assembly 10 through the cooling fluid outlet, thereby effectively removing heat from the substrate 100.

It should be understood that the bonding assembly 10 may include various flow paths and configurations through the MIO bonding structure 120. Effectively, the flow of the cooling fluid through the cooling fluid circuit is configured to remove heat from the substrate 100. Non-limiting examples of the cooling fluid may include dielectric cooling fluids such as aromatics, silicate-ester, silicones, fluorocarbons, and/or the like. Accordingly, the MIO bonding structure 120 may provide various benefits and functionalities for the bonding assembly 10, including but not limited to a thermal stress compensation layer between the substrate 100 and the cap structure 110, an electrically conductive path between a first electrode (not shown) and a second electrode (not shown) disposed on opposite surfaces of the bonding assembly 10, and a thermally conductive cooling layer for the substrate 100.

Figure 4E:
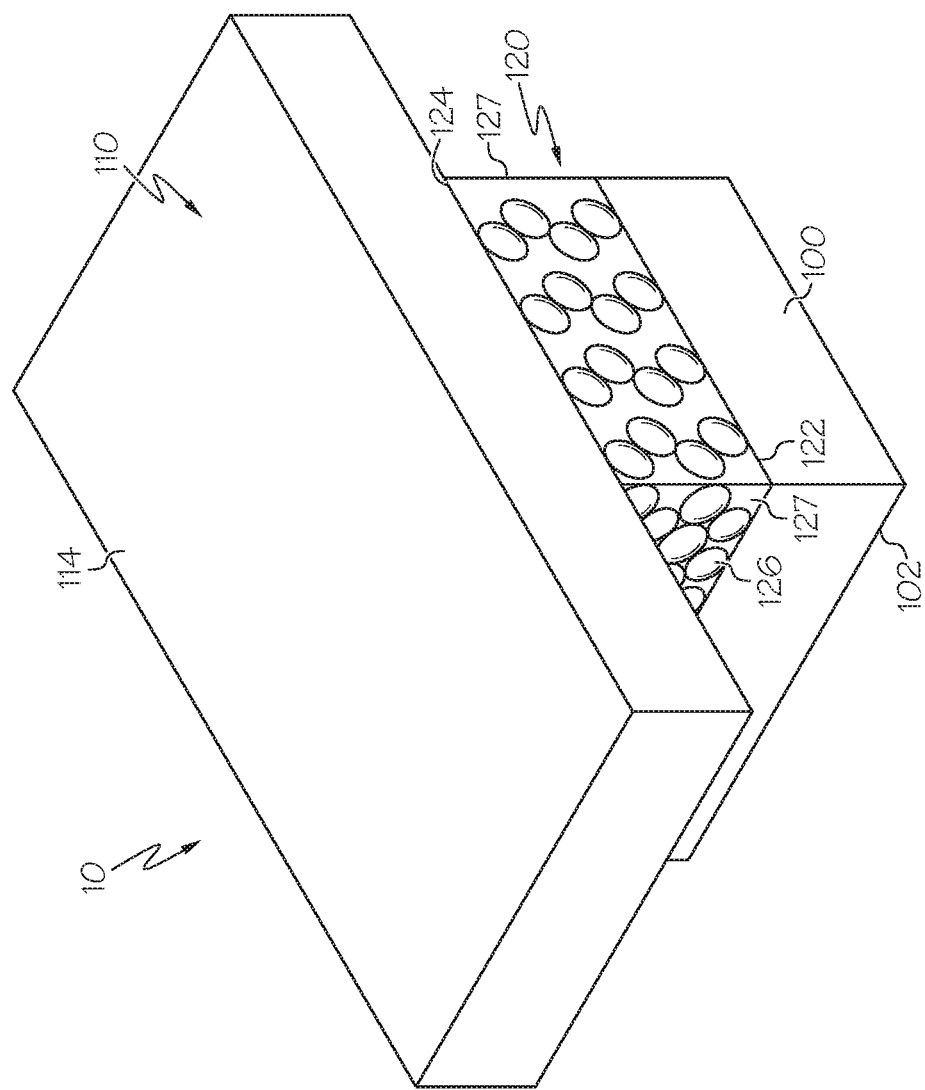
FIG. 4E schematically depicts the method of FIG. 2E in fabricating the bonding assembly of FIG. 1 by removing overhang portions of the metal inverse opal structure according to one or more embodiments shown and described herein.

At step 212, a side portion(s) 127 of the MIO bonding structure 120 may be etched to remove any overhang portion(s) 123 of the MIO bonding structure 120 that exceed a length of the bottom surface 104 of the substrate 100. In the present example, referring now to FIGS. 2D and 4D, the MIO bonding structure 120 includes a pair of overhang portions 123 that extend laterally beyond the length of the bottom surface 104 of the substrate 100. In this instance, as seen in FIGS. 2E and 4E, the side portions 127 of the MIO bonding structure 120 are removed to thereby size and shape the MIO bonding structure 120 in accordance with the size of the substrate 100. It should be understood that step 212 of the method 200 is merely optional such that, in some embodiments, the bonding assembly 10 may include the MIO bonding structure 120 having the side portions 127 extending beyond the bottom surface 104 of the substrate 100 thereby forming the overhang portion(s) 123 as seen in FIG. 2D.

It should be understood that, in other embodiments, the bonding assembly 10 may include other arrangements and configurations than that shown and described above. In some embodiments a bonding assembly 20 may include a second MIO bonding structure formed along the top surface 102 of the substrate 100, opposite of the MIO bonding structure 120 formed along the bottom surface 104 of the substrate 100. It should be understood that the second MIO bonding structure may be formed along the top surface 102 of the substrate 100 in a substantially similar manner as MIO bonding structure 120 is formed along the bottom surface 104 as will be described herein. In this instance, a second cap structure may be disposed over the second MIO bonding structure to serve as another metal substrate for the bonding assembly 20, such that the substrate 100 (i.e., a power semiconductor device) is disposed between two metal substrates. Accordingly, each cap structure is bonded to the substrate 100 by a separate MIO bonding structure disposed therebetween, respectively.

In other embodiments, a bonding assembly may include a second MIO bonding structure formed along the bottom surface 114 of the cap structure 110, opposite of the MIO bonding structure 120 formed along the top surface 112 of the cap structure 110. It should be understood that the second MIO bonding structure may be formed along the bottom surface 114 of the cap structure 110 in a substantially similar manner as described herein with respect to MIO bonding structure 120. A second substrate may be disposed over the second MIO bonding structure such that two substrates are bonded to the cap structure 110 with the cap structure 110 disposed between the two substrates (i.e., power semiconductor devices). Accordingly, each substrate is bonded to the cap structure 110 by a separate MIO bonding structure.

Figure 5:
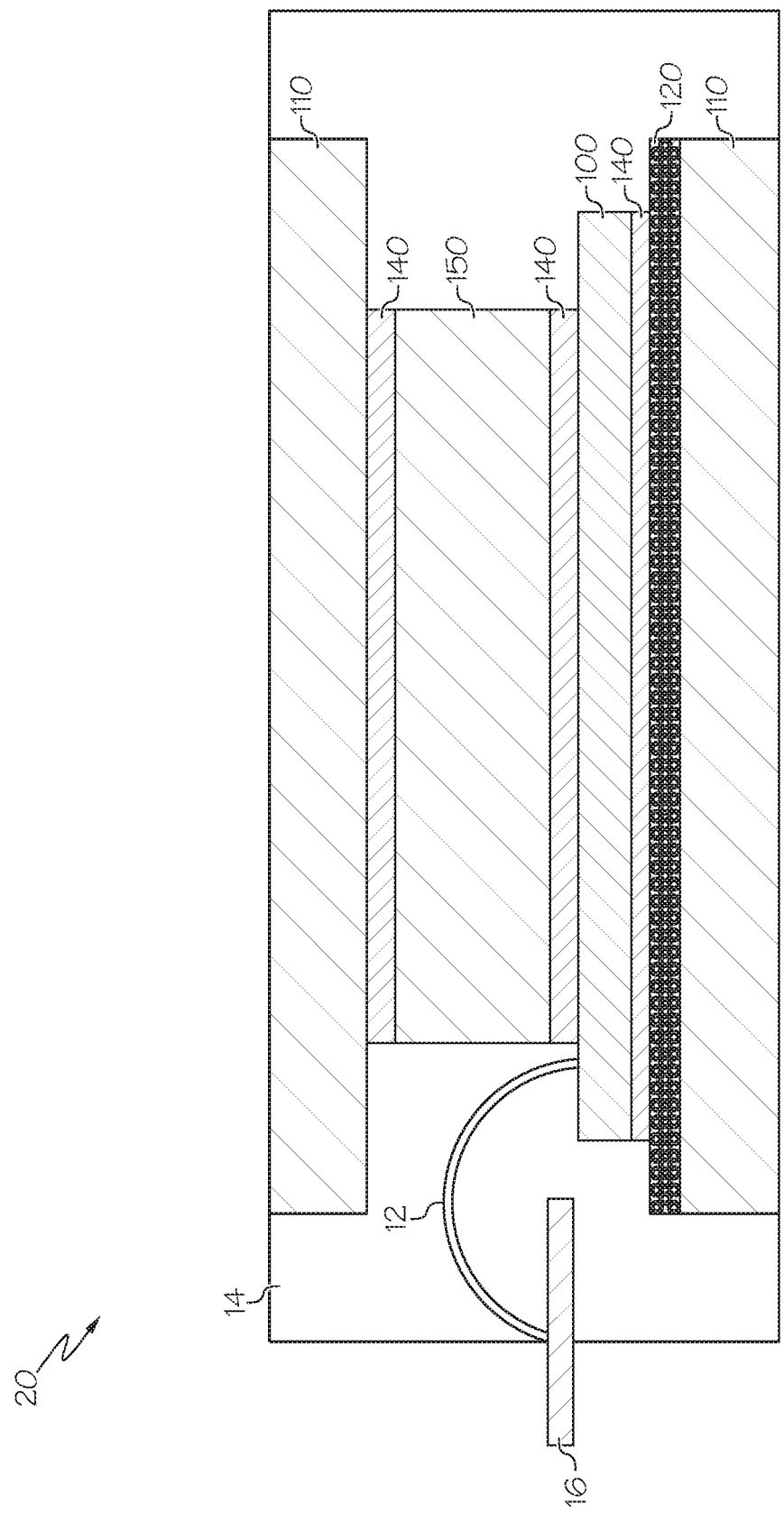
FIG. 5 schematically depicts a side view in partial cross-section of an alternative bonding assembly according to one or more embodiments shown and described herein.

Referring now to FIG. 5, a non-limiting example of a bonding assembly 20 (e.g., a power electronics assembly) is schematically illustrated having double-sided cooling of the substrate 100 (e.g., power electronic device). Except for the differences explicitly noted herein, it should be understood that the bonding assembly 20 is similar to the assembly described above such that the bonding assembly 20 may be configured and operable just like the bonding assembly 10. Accordingly, identical components are marked with the same reference numerals. It should be understood that any components and operabilities of the bonding assembly 20 that are not explicitly described below may be the same as the components and operabilities of the bonding assembly 10 described above.

The bonding assembly 20 described herein may include at least one substrate 100 within a stack of thermally coupled components. The substrate 100 may form one or more layers positioned between one or more additional layers that include substrates, bond layers, spacer layers, and/or the like. For example, the bonding assembly 20 may include a pair of cap structures 110 disposed about opposing ends with the substrate 100 disposed therein. In particular, the MIO bonding structure 120 is formed along the top surface 112 of a first of the pair of cap structures 110 and the substrate 100 is bonded to the MIO bonding structure 120 with a bonding layer 140 disposed therebetween. The bonding layer 140 is formed between the substrate 100 and the MIO bonding structure 120 in response to the substrate 100 being transient liquid phase (TLP) bonded to the cap structure 110 as described in detail above. It should be understood that a low melting temperature material is initially disposed between the substrate 100 and the MIO bonding structure 120 such that the low melting temperature material is melted and diffused into the adjacent layers to thereby form an intermetallic compound layer therein (i.e., the bonding layer 140) in response to the bonding assembly 20 undergoing TLP bonding.

The substrate 100 is further bonded to a spacer layer 150, along a top surface 102 of the substrate 100 which is opposite of the bottom surface 104 that is bonded to the first of the pair of cap structures 110, via the bonding layer 150 disposed therebetween. Similarly, a bonding layer 140 is disposed between the substrate 100 and the spacer layer 150 as a result of the substrate 100 undergoing TLP bonding with the spacer layer 150 with a low melting temperature material disposed therebetween. In this instance, the substrate 100 is disposed between a pair of bonding layers 140, respectively. The second of the pair of cap structures 110 is deposited onto a top surface of the spacer layer 150, opposite of the bottom surface that is bonded to the substrate 100. In this instance, the cap structure 110 is bonded thereto via a bonding layer 140.

The spacer layer 150 may include a spacer material that is capable of electric and thermal conduction, such as but not limited to, copper, aluminum, nickel, gallium, or any other metal, alloy, or compound that is capable of electrical and/or thermal conduction. It should be understood that the spacer layer 150 is sized and shaped to accommodate for the attachment of a wire 12 to the substrate 100 (e.g. power electronic device) of the bonding assembly 20. In this instance, the spacer layer 150 is configured to provide a clearance between the substrate 100 and the second of the pair of cap structures 110 to thereby expose a portion of the substrate 100 for connection with the wire 12.

The pair of cap structures 110 may be a thermally conductive metal, a semiconductor material, an electrode, and/or the like. In some embodiments, the first of the pair of cap structures 110 may be a collector terminal of the bonding assembly 20 (e.g., power electronic assembly) and the second of the pair of cap structures 110 may be an emitter terminal of the bonding assembly 20. In some embodiments, the bonding assembly 20 may be thermally coupled to a cooling structure (not shown) along the outer surfaces of the bonding assembly 20, and in particular, at the pair of cap structures 110. The cooling structure may be a fluid cooler, heat sink, heat exchanger, vapor chamber, liquid-phase cooling apparatus, either active (e.g., utilizing jet channels and pumps), passive (e.g., utilizing thermal convection, conduction, radiation, including processes such as nucleation or the like), or a combination of both, or other cooling structure capable of removing heat from the bonding assembly 20. In some embodiments, the cooling structure may include an air-cooled heat sink or a liquid-cooled heat sink, such as a jet impingement or channel-based heat sink device. Additionally or alternatively, the cap structures 110 of the bonding assembly 20 may further include a thermal grease coating disposed along surfaces of the pair of cap structures 110. In some embodiments, the cap structure 110 may be directly bonded to the cooling structure using a variety of bonding techniques, such as but not limited to TLP sintering, solder, brazing, or diffusion bonding, for example. It should be understood that at least one electrical isolation layer (not shown) may be deposited between the MIO bonding structure 120 and the other remaining layers of the bonding assembly 20, including but not limited to the cap structures 110 and/or the substrate 100, such that the MIO bonding structure 120 is effectively isolated from receiving the cooling fluid inserted into the bonding assembly 20 via the cooling structure therein. The at least one electrical isolation layer may be made from any non-electrical conductive material, such as, without limitation, aluminum oxide. As non-limiting examples, the at least one electrical isolation layer may be deposited by atomic layer deposition or chemical vapor deposition.

To compensate for increased thermal stresses endured within the bonding assembly 20, as caused by operation of the substrate 100 (i.e., the power electronic device), the MIO bonding structure 120 includes the plurality of hollow spheres 126. As described above, the hollow spheres 126 define a skeletal network of metal with a periodic arrangement of interconnected hollow spheres 126. In particular, the hollow spheres 126 refer to spherical voids within the MIO bonding structure 120 that do not have a solid material disposed therein. The MIO bonding structure 120 may exhibit a reduced Young's modulus (e.g., reduced stiffness) as a result which may allow some flexibility in the MIO bonding structure 120 to compensate for the thermal stresses during temperature cycling of the substrate 100. It should be understood that the bonding assembly 20 may include additional MIO bonding structures 120 disposed therein and positioned throughout the various layers of the bonding assembly 20 to provide enhanced compensation for the increased thermal stresses caused by the substrate 100.

The bonding assembly 20 may include a gate electrode 16 that is electrically coupled to the substrate 100. In the present example, the gate electrode 16 is electrically coupled to the substrate 100 (e.g., power electronic device) via the wire 12 that is secured to the top surface 102 of the substrate 100. It should be understood that in other embodiments the gate electrode 16 may be directly electrically coupled to the substrate 100 such that the wire 12 is omitted. In some embodiments, a signal, such as a gate voltage, may be applied to the gate electrode 16 to cause the substrate 100 to conduct such that the pair of cap structures 110 may be electrically coupled to one another. The bonding assembly 20 may further include a resin 14 that is configured to provide a supporting structure or package to the components of the bonding assembly 20. It should be understood that FIG. 5 depicts only one possible embodiment of a bonding assembly 20 and should not be limited to such components and configuration.

It should be understood that the substrates (e.g., power semiconductor devices) and bonding assemblies (e.g., power electronics assemblies) described herein may be incorporated into an inverter circuit or system that converts direct current electrical power into alternating current electrical power and vice versa depending on the particular application. For example, in a hybrid electric vehicle application (not shown), several power electronics assemblies may be electrically coupled together to form a drive circuit that converts direct current electrical power provided by a bank of batteries into alternating electrical power that is used to drive an electric motor coupled to the wheels of a vehicle to propel the vehicle using electric power. The power electronics assemblies used in the drive circuit may also be used to convert alternating current electrical power resulting from use of the electric motor and regenerative braking back into direct current electrical power for storage in the bank of batteries.

Power semiconductor devices utilized in such vehicular applications may generate a significant amount of heat during operation, which require bonds between the substrate (e.g., semiconductor devices) and cap layers (e.g., metal substrates) that can withstand higher temperatures and thermally-induced stresses due to CTE mismatch. The MIO bonding structure described and illustrated herein may compensate for the thermally-induced stresses generated during thermal bonding of the semiconductor devices to the metal substrate by manageably controlling the thermal expansion and/or stiffness experienced by the layers of the metal substrate and semiconductor devices while also providing a compact package design. The MIO bonding structure may also provide an electrically conductive path between the substrate 100 and the cap structure 110, and in some embodiments, a pair of electrodes disposed along the substrate 100 and the cap structure 110. The MIO bonding structure may further provide a cooling layer for cooling the semiconductor devices during operation of the power electronics devices.

It should now be understood that the MIO bonding structures incorporated into the power electronics assemblies and vehicles described herein may be utilized to reduce thermally induced stresses due to CTE mismatch without the need for additional interface layers, provide an electrically conductive pathway between electrodes and provide a cooling layer for semiconductor devices thereby providing for a more compact package design with reduced thermal resistance. It should be further understood that the integration of the MIO bonding structure directly onto the substrate (e.g., power semiconductor device) may provide a simplified method for fabricating a power electronic assembly (i.e., bonding a semiconductor device to a metal substrate) than conventional methods.

It is noted that the term "about" and "generally" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue. The terms "top", "bottom" and "middle" are used in relation to the figures and are not meant to define an exact orientation of power electronics assemblies or layers used to form power electronic assemblies described herein.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. A method for forming a bonded assembly, the method comprising:
   positioning a substrate against a polymer support;
   depositing a metal onto and within the polymer support;
   disposing a cap layer onto the polymer support opposite of the substrate to form a bottom electrode;
   removing the polymer support from between the substrate and the cap layer to form a metal inverse opal structure disposed therebetween; and
   providing an electrical isolation layer between the cap layer and the metal inverse opal structure, wherein the electrical isolation layer is provided by:
   prior to disposing the cap layer onto the polymer support, depositing the electrical isolation layer on a surface of the metal and the polymer support; or
   prior to disposing the cap layer onto the polymer support, depositing the electrical isolation layer on a surface of the cap layer.

2. The method of claim 1, further comprising removing excess portions of the metal inverse opal structure that laterally extend beyond a length of the substrate.

3. The method of claim 2, wherein removing portions of the metal inverse opal structure comprises etching the metal inverse opal structure.

4. The method of claim 1, wherein disposing the cap layer comprises electrodepositing the cap layer onto the polymer support.

5. The method of claim 1, wherein the polymer support is removed prior to disposing the cap layer such that the cap layer is disposed onto the metal inverse opal structure formed along the substrate.

6. The method of claim 1, wherein the cap layer comprises a thickness within a range of 1 millimeter to 2 millimeters, including endpoints.

7. The method of claim 1, wherein the substrate is electrically coupled to the bottom electrode through the metal inverse opal structure.

8. The method of claim 1, wherein the substrate is a semiconductor device formed of silicon (Si) or silicon carbide (SiC).

9. The method of claim 1, further comprising bonding the cap layer to a cooling device opposite of the metal inverse opal structure that is disposed between the cap layer and the substrate.

10. The method of claim 1, wherein the metal inverse opals comprise copper inverse opals.

11. The method of claim 1, wherein the polymer support comprises a polystyrene structure including a plurality of pores and the metal inverse opal structure comprises a plurality of microspheres.

12. The method of claim 1, wherein the removing the polymer support comprises dissolving the polymer support with a solution.

13. The method of claim 12, wherein the metal inverse opal structure includes a porosity that facilitates thermal exchange between the semiconductor device and the bottom electrode.

14. A method for bonding a semiconductor device to a substrate using metal inverse opals, the method comprising:
    positioning the semiconductor device onto a polymer support;
    electrodepositing metal onto and within the polymer support thereby bonding the semiconductor device to the polymer support;
    removing the polymer support from the semiconductor device to provide a metal inverse opal structure secured along the semiconductor device, wherein the metal inverse opal structure is a cooling layer configured to receive a cooling fluid therethrough;
    depositing a cap layer onto the metal inverse opal structure to form the substrate that is coupled to the semiconductor device;
    providing an electrical isolation layer between the cap layer and the metal inverse opal structure, wherein the electrical isolation layer is provided by:
        prior to depositing the cap layer on the metal inverse opal structure, depositing the electrical isolation layer on a surface of the metal and the polymer support; or
        prior to depositing the cap layer on the metal inverse opal structure, depositing the electrical isolation layer on a surface of the cap layer; and
    removing a side portion of the metal inverse opal structure that laterally extends beyond a length of the semiconductor device.

15. The method of claim 14, wherein the removing the polymer support comprises dissolving the polymer support with a solution.

16. The method of claim 14, removing the side portion of the metal inverse opal structure comprises etching the metal inverse opal structure.

17. The method of claim 14, further comprising:
    bonding a cooling device to the substrate such that the cooling device is thermally coupled to the semiconductor device through the metal inverse opal structure disposed between the substrate and the semiconductor device.

18. A method for forming a power electronic assembly comprising:
    attaching a polystyrene mesh to a semiconductor device;
    electrodepositing copper onto the polystyrene mesh to bond the semiconductor device to the polystyrene mesh;
    depositing a cap structure onto the polystyrene mesh to form a copper substrate;
    dissolving the polystyrene mesh to produce a copper inverse opal structure in contact with the semiconductor device and the copper substrate; and
    providing an electrical isolation layer between the cap structure and the copper inverse opal structure, wherein the electrical isolation layer is provided by:
        prior to depositing the cap structure onto the polystyrene mesh, depositing the electrical isolation layer on a surface of the polystyrene mesh that is bonded to the semiconductor device; or
        prior to depositing the cap structure onto the polystyrene mesh, depositing the electrical isolation layer on a surface of the cap structure.

19. The method of claim 18, wherein the semiconductor device is electrically coupled to the copper substrate through the copper inverse opal structure.

20. The method of claim 18, wherein the semiconductor device is formed of silicon (Si) or silicon carbide (SiC).

* * * * *